United States Patent
Van Munster et al.

(10) Patent No.: US 12,516,411 B2
(45) Date of Patent: Jan. 6, 2026

(54) CHEMICAL VAPOR DEPOSITION CHAMBER ARTICLE

(71) Applicant: SCHUNK XYCARB TECHNOLOGY B.V., Helmond (NL)

(72) Inventors: Marcus Gerardus Van Munster, Helmond (NL); Guiming Song, Helmond (NL)

(73) Assignee: SCHUNK XYCARB TECHNOLOGY B.V., Helmond (NL)

( * ) Notice: Subject to any disclaimer, the term of this patent is extended or adjusted under 35 U.S.C. 154(b) by 212 days.

(21) Appl. No.: 17/614,805

(22) PCT Filed: May 27, 2019

(86) PCT No.: PCT/NL2019/050304
§ 371 (c)(1),
(2) Date: Nov. 29, 2021

(87) PCT Pub. No.: WO2020/242292
PCT Pub. Date: Dec. 3, 2020

(65) Prior Publication Data
US 2022/0228260 A1    Jul. 21, 2022

(51) Int. Cl.
*C23C 16/44* (2006.01)
*C23C 16/458* (2006.01)
(Continued)

(52) U.S. Cl.
CPC ...... *C23C 16/4404* (2013.01); *C23C 16/4581* (2013.01); *C30B 25/12* (2013.01); *H01L 21/68757* (2013.01)

(58) Field of Classification Search
None
See application file for complete search history.

(56) References Cited

U.S. PATENT DOCUMENTS 5,851,678 A * 12/1998 Hasz ............. C04B 35/01
                                                    428/689
6,129,808 A * 10/2000 Wicker ......... H01J 37/321
                                                    156/914
(Continued)

FOREIGN PATENT DOCUMENTS

EP    1793021 A2    6/2007

OTHER PUBLICATIONS

Rapoport, et al., "Wafer surface contamination reduction from silicon carbide components at elevated temperatures", ECS, Oct. 18, 2005, XP055661931.

(Continued)

*Primary Examiner* — Sylvia MacArthur
(74) *Attorney, Agent, or Firm* — CANTOR COLBURN LLP

(57) ABSTRACT

The present invention relates to a chemical vapor deposition chamber article. The present invention further relates to a method of processing an article of a chemical vapor deposition chamber for manufacturing semiconductor components, as well as chemical vapor deposition chamber article obtained through such a method. In a first aspect of the invention, there is provided, a chemical vapor deposition chamber article such as a wafer carrier, for manufacturing semiconductor components, said chamber article having a body and a surface comprised of silicon carbide, characterized in that said surface is provided with a protective layer at least on parts of said surface which are subject to parasitic deposition during said manufacturing of said semiconductor components in said chamber, and wherein said protective layer comprises an oxidized surface.

14 Claims, 3 Drawing Sheets

Figure 1:
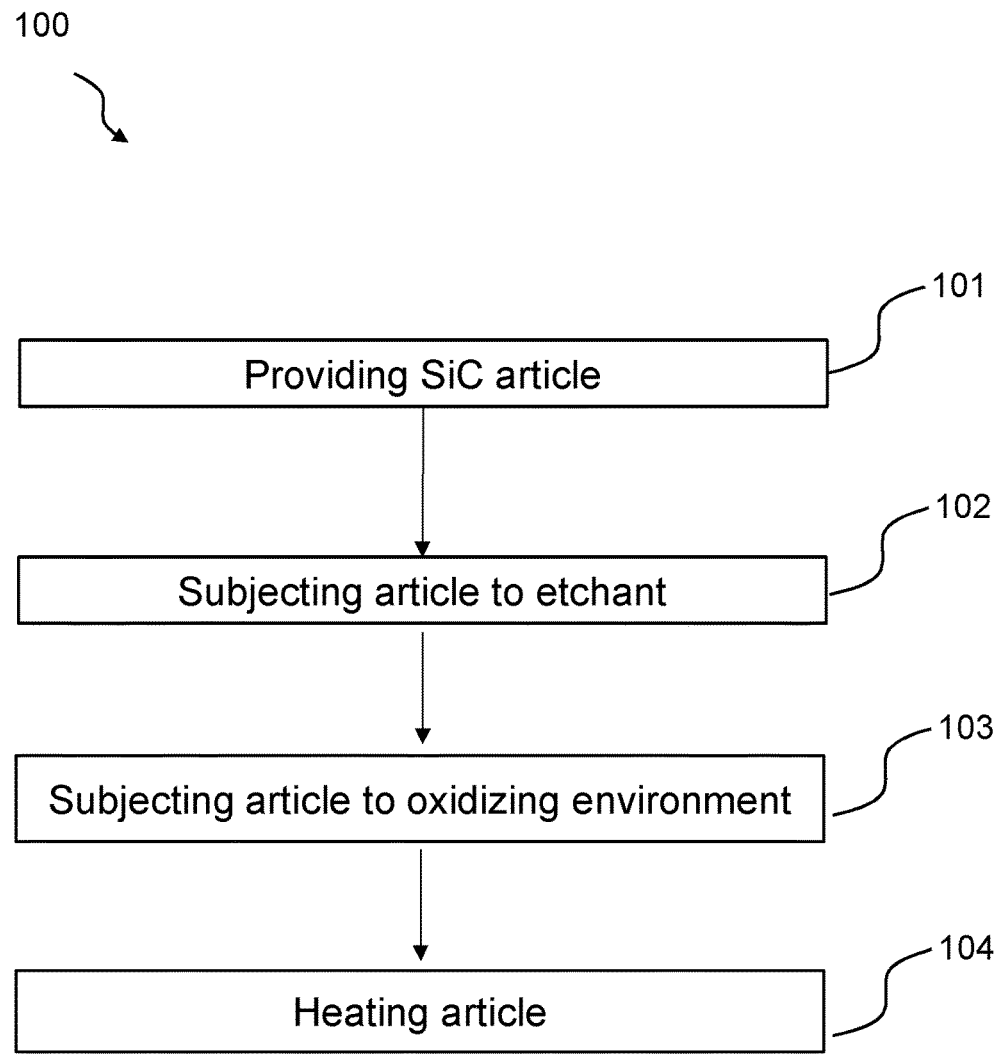

(51) Int. Cl.
*C30B 25/12* (2006.01)
*H01L 21/687* (2006.01)

(56) References Cited

U.S. PATENT DOCUMENTS

| | | | |
|---|---|---|---|
| 6,379,575 B1* | 4/2002 | Yin | C04B 41/009 |
| | | | 134/1.1 |
| 6,825,051 B2 | 11/2004 | Amrhein | |
| 7,267,741 B2* | 9/2007 | Ren | H01L 21/67069 |
| | | | 156/345.1 |
| 8,430,960 B2 | 4/2013 | Sumakeris et al. | |
| 2004/0023516 A1* | 2/2004 | Londergan | H01L 21/02189 |
| | | | 438/785 |
| 2012/0108081 A1* | 5/2012 | Olgado | H01L 21/68764 |
| | | | 257/E21.328 |
| 2012/0227665 A1* | 9/2012 | Ozgun | C23C 16/481 |
| | | | 219/448.17 |
| 2012/0272892 A1* | 11/2012 | Paranjpe | C30B 35/00 |
| | | | 118/724 |
| 2015/0321966 A1 | 11/2015 | Shinohara | |
| 2016/0122573 A1* | 5/2016 | Uprety | C23C 16/30 |
| | | | 427/569 |

OTHER PUBLICATIONS

International Search Report for corresponding application PCT/NL2019/050304 filed May 27, 2019: Mail date Feb. 3, 2020.
Written Opinion of the International Searching Authority for corresponding application PCT/NL2019/050304 filed May 27, 2019: Mail date Feb. 3, 2020.

* cited by examiner

400

CHEMICAL VAPOR DEPOSITION CHAMBER ARTICLE

The present invention relates to a chemical vapor deposition chamber article. The present invention further relates to a method of processing an article of a chemical vapor deposition chamber for manufacturing semiconductor components, as well as a chemical vapor deposition chamber article obtained through such a method.

For the manufacturing of semiconductor components, such as integrated circuits, Light Emitting Diodes, LEDs, and so on, it has long been a practice to employ Chemical Vapor Deposition, for homo- and hetero-epitaxial growth of various material layers on semiconductor substrates under conditioned environments as part of the process of manufacturing of these semiconductor components. Under these conditioned environments typically a wafer or substrate is placed on a carrier and exposed to one or more volatile precursors which react and/or decompose on the substrate surface to produce the desired deposit.

The articles in the CVD chamber are typically made from materials such as technical ceramics, quartz and coated graphite. Graphite chamber articles are typically coated with a layer of Silicon Carbide, SiC, and such SiC or other technical ceramic articles may be used for rapid thermal processing, in which the wafer is heated from room temperature to an elevated temperature within approximately less than a minute, diffusion, annealing, or epitaxial growth processes.

During the deposition in the deposition chamber of the CVD apparatus one or various materials are grown, in layers, on the wafer or substrate. The growth or deposition of these materials however does not only take place on the wafers or substrates, where it is indented to grow, but also on the chamber articles which are subject to the deposition process as well. Such deposition in the chamber which does to take place on the wafer is undesirable.

Such undesirable growth or deposition of these materials on the chamber articles is generally known as parasitic deposition. The parasitic deposition is undesirable since it prevents maintaining the stability of the deposition process conditions which are required to produce high quality deposition layers.

Parasitic deposits could be controlled in a deposition system for depositing a film on a substrate by flowing a buffer gas between the interior surface and at least a portion of the process gas to form a gas barrier layer such that the gas barrier layer inhibits contact between the interior surface and components of the process gas, as for example disclosed in U.S. Pat. No. 8,430,960. Such method could be employed to reduce the parasitic deposition on interior chamber surfaces that are not bearing the substrate(s) under process (i.e. wafer carriers), or that are not located in a level-upstream position from the chamber surfaces that are bearing the substrate(s) under process, as this would adversely affect the epitaxial deposition process. On the surfaces that by design of the deposition chamber cannot benefit from the above-presented method of reducing parasitic deposition this results in an early end-of-life of these articles which may typically occur even after a few runs of use in the deposition chamber. As an alternative, or in addition to the aforementioned, the articles may undergo a chemical or mechanical cleaning after several operational runs. Mechanical may typically introduce other artefacts such as micro-cracks. Chemical cleaning may be done through etching the surface of the article with an etchant. During etching of the article not only the parasitic deposition is etched, but also the article itself which may thus result in damage to the surface and eventually to the end-of-life of the article.

It is an object of the present invention to provide chemical vapor deposition or other deposition chamber articles which mitigates at least some of the above-mentioned drawbacks.

It is a further object of the present invention to provide improved chemical vapor deposition chamber articles which are arranged for chemical cleaning with an etchant which removes at least most of the parasitic deposition without damaging the surface of the article.

In a first aspect of the invention, there is provided, a chemical vapor deposition chamber article such as a wafer carrier, for manufacturing semiconductor components, said chamber article having a body and a surface comprised of metal carbide, characterized in that said surface is provided with a protective layer at least on parts of said surface which are subject to parasitic deposition during said manufacturing of said semiconductor components in said chamber, and wherein said protective layer comprises an oxidized surface.

As indicated, Chemical Vapor Deposition, CVD, reaction chambers are used for epitaxy growth of Silicon Carbide, SiC components. Typically, a hot wall type of reaction chamber is used. The SiC components are often manufactured from graphite and coated with SiC. The reaction chamber houses several chamber articles, amongst which the substrate carrier or wafer carrier. On top of the carrier a substrate is placed, e.g. a SiC substrate, on which the epitaxial SiC layers are grown during the epitaxy process. These metal carbide articles, like the carriers are itself typically made from graphite which is coated with SiC as well. They may however also be formed from solid, monolithic SiC, or Tantalum Carbide, TaC coated graphite, or metal carbides in general.

During the epitaxy growth of the SiC a desired SiC epitaxy layer is formed on the substrate of wafer. Undesired SiC layers are however also formed on other positions within the reaction chamber, for example on the carrier itself or on other articles such as heat-rings, lift pins, etc. Each article within the reaction chamber which comprises SiC may be susceptible to such undesired SiC growth which is commonly known as parasitic deposition. It however may not always be an epitaxy layer. The deposition on the CVD SiC coated graphite may grow polycrystalline as well, for being the case in polycrystalline SiC and non-SiC materials.

In order to remove the parasitic deposition, the metal carbide article may undergo a chemical cleaning process in which an etchant is used. Since there is no difference in materials between the desired epitaxy deposition and the undesired parasitic deposition, both being metal carbides, and in particular SiC or TaC, the chemical cleaning is extremely challenging. Upon etching, both epitaxy and parasitic SiC are in more or less the same degree susceptible to the etchant.

It is proposed to etch the metal carbide comprising article with a halogen etchant. Preferably the halogen used is Chlorine, and the preferred metal carbide is SiC and TaC. The latter being preferred for high temperature SiC epitaxy processes.

In order to increase the etch resistance, a tantalum Carbide, TaC, may be applied. TaC is however significantly more expensive, and susceptible to delamination of the coating from the graphite substrate and the emissivity change of TaC coatings as TaC is coated with the epitaxy SiC.

It was an insight of the inventors to increase etch resistance of the article such that an (aggressive) etchant may used to etch away the parasitic deposition of SiC without damaging the SiC surface of the article itself.

The inventors found out, that providing a protective layer at least on parts of the surface which are subject to parasitic deposition during said manufacturing of the semiconductor components in the chamber, wherein the protective layer comprises an oxidized surface, may provide greatly suppress the etch rate of the SiC or TaC article.

The protective oxidized surface enables the use of (highly aggressive) etchants such as HCl, $Cl_2$, $NF_3$, $ClF_3$, etc., which effectively removes the parasitic SiC deposition or particles, without etching the etch resistant CVD SiC coated article itself. By use of such protective surface, the lifetime of these SiC articles is extended, which is economically favourable.

Preferably (pure) $Cl_2$ may be used to remove the parasitic SiC deposition or particles, which $Cl_2$ may react with the SiC at elevated temperature according to the following equation:

$$SiC + 2Cl_2 = SiCl_4(g) + C$$

As a result of the reaction above, or other applicable etchant on the SiC, the SiC is converted into carbon. The carbon then may be removed, fully or partially by oxidation. Accordingly, not only the parasitic SiC deposition or particles deposited on the carrier surface is etched, but also the carrier surface which is coated with a CVD SiC coating or manufactured from solid or pure SiC is etched as well.

With the present invention CVD SiC coated graphite articles or parts of the reaction chamber are suggested, including carriers or CVD SiC coated parts of components of an alternative base material than graphite. The CVD SiC coated parts according to the invention have superior etch resistance upon Cl2 etchant, HCl etchant or other typical etchant. This means $Cl_2$ only etches the parasitically deposited SiC matter created during the SiC epitaxy process, but does not, or to a significantly lesser extent, etch the etch-resistant CVD SiC coated article itself.

Throughout the description any mentioning of SiC article is not to be interpreted in a limiting manner to a CVD SiC on a substrate carrier, but can also be a bulk, free-standing CVD-SiC article, or CVD SiC coated SiC article, or other material that is coated with the etch resistant CVD SiC.

As yet another alternative, the SiC article may also be any metal carbide coated chamber article or bulk silicon material such as a reaction chamber metal carbide coated article, which comprises an oxide layer or oxidized surface or metal oxicarbide surface.

The proposed reaction chamber articles may also comprise a body and a coated surface of Tantalum Carbide, TaC. Since TaC have a more intrinsic etch resistance, TaC may have advantages over SiC as a coating material for reaction chamber parts. TaC however also has disadvantages, e.g. being more expensive, and its susceptibility to delamination from the graphite substrate.

In an example, the protective layer is comprised of a silicon dioxide surface.

In an example, the protective layer comprises a silicon monoxide surface.

In an example, the protective layer comprises a silicon oxycarbide surface.

Several types of etchants may be used on the SiC material, e.g. SiC can be etched by HCl, Cl2, ClF3, NF3, etc. The etch mechanism may give different equations and thus formation of different elements, e.g.

$$SiC + HCl \rightarrow SiCl_4\uparrow + CH_4\uparrow$$

$$SiC + 2Cl_2 \rightarrow SiCl_4\uparrow + C$$

$$SiC + ClF_3 \rightarrow SiF_4\uparrow + 3CF_4\uparrow + Cl_2\uparrow$$

Of the above mentioned etch mechanism $Cl_2$ is preferred over HCl for having a higher etch rate at high temperatures. $ClF_3$ however shows a fast etch rate at relative lower temperatures.

In an example, the SiC article may also undergo a thermal etching by heating SiC to certain predetermined high temperatures such a approximately 1200 degrees Celsius. ClF3 shows a fast etch rate at relative lower temperatures [3], and the etch mechanism are shown as follows.

In an example, the body of the article consist of silicon carbide.

The invention is not limited to reaction chamber articles which have a SiC coating. Chamber articles being formed from solid or monolithic SiC may also undergo the same surface treatment for obtaining the etch resistive oxidized surface.

In an example, the body of the article consist of a graphite core having a silicon carbide coated surface.

As an alternative to the solid SiC, the article may also have a graphite core and a SiC coating, which may undergo the same surface treatment for obtaining the etch resistive oxidized surface. Alternatively, the graphite or other core or body may also have tantalum carbide coating which may undergo the surface treatment for obtaining the etch resistive oxidized surface.

In an example, the protective layer is obtained by subjecting the article to a halogen based etchant, preferably $Cl_2$ based, pure $Cl_2$, or HCl etchant.

In an example, the protective layer is obtained by subjecting the etched article to an oxidation process at elevated temperatures converting carbon at the surface obtained from the etching into a $SiO_2$ or SiO or $SiO_xC_y$ protective layer.

Oxidizing the CVD-SiC coated graphite wafer carrier at high temperatures will form a fully dense $SiO_2$ or SiO or $SiO_xC_y$ layer covering part of a surface, but preferably, the whole surface of a side of the article facing towards the inside of the reaction chamber during use, and most preferably the full surface circumference of the article. This $SiO_2$ or SiO or $SiO_xC_y$ layer gives a protection of the CVD SiC upon the $Cl_2$ or HCl etching at high temperatures.

The oxide layer in example has one oxide phase or in another example consists of one of the $SiO_2$, SiO, and $SiOxC_y$ phases or in an example of several phases with one phase from $SiO_2$, SiO and $SiO_xC_y$ phases. In yet another example, the oxide containing layer contains one or more phases of $SiO_2$, SiO and $SiO_xC_y$ phases In a second aspect of the invention a method is proposed of processing an article of a chemical vapor deposition chamber for manufacturing semiconductor components, the method comprising the steps of:
  providing the article, the article having a body and a surface comprised of silicon carbide;
  providing a protective layer at least on parts of the surface which are subject to parasitic deposition during the manufacturing of the semiconductor components in the chamber, and wherein providing the protective layer comprises obtaining an oxidized surface.

In an example, the step of providing the protective article comprises:

subjecting the article to a halogen based etchant, preferably $Cl_2$ based, pure $Cl_2$, or HCl etchant.

In an example, the step of providing the protective article further comprises:
subjecting the article to an oxidizing environment;
heating said article to a predetermined elevated temperature, wherein carbon formed on said surface of said article during said step of etching is oxidized and removed as CO or $CO_2$ thereby forming a $SiO_2$ or SiO or $SiO_xC_y$ protective layer covering at least said part of said surface of said article being subject to parasitic deposition during said manufacturing of said semiconductor components in said chamber.

In a third aspect of the invention, a chemical vapor deposition chamber article is proposed which is processed according to the above mentioned method wherein the chamber article comprises any one of the group of a wafer carrier, wafer susceptor, pre-heat ring, or lift pin used in an epitaxial chemical vapor deposition growth chamber.

Figure 2A:
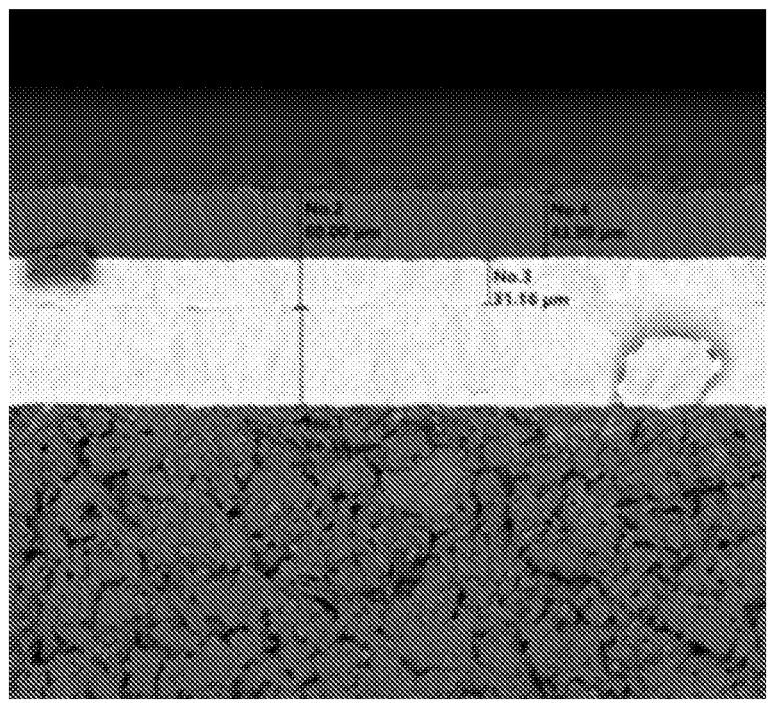
Figure 2B:
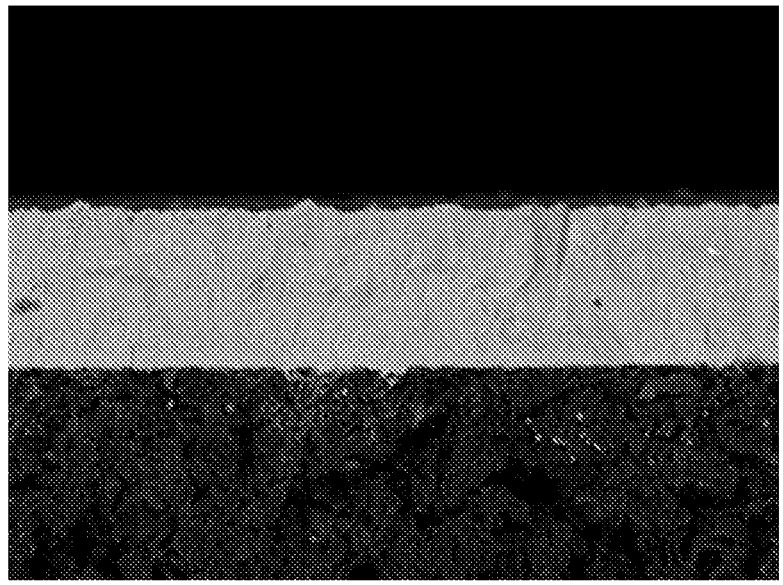
Figure 2C:
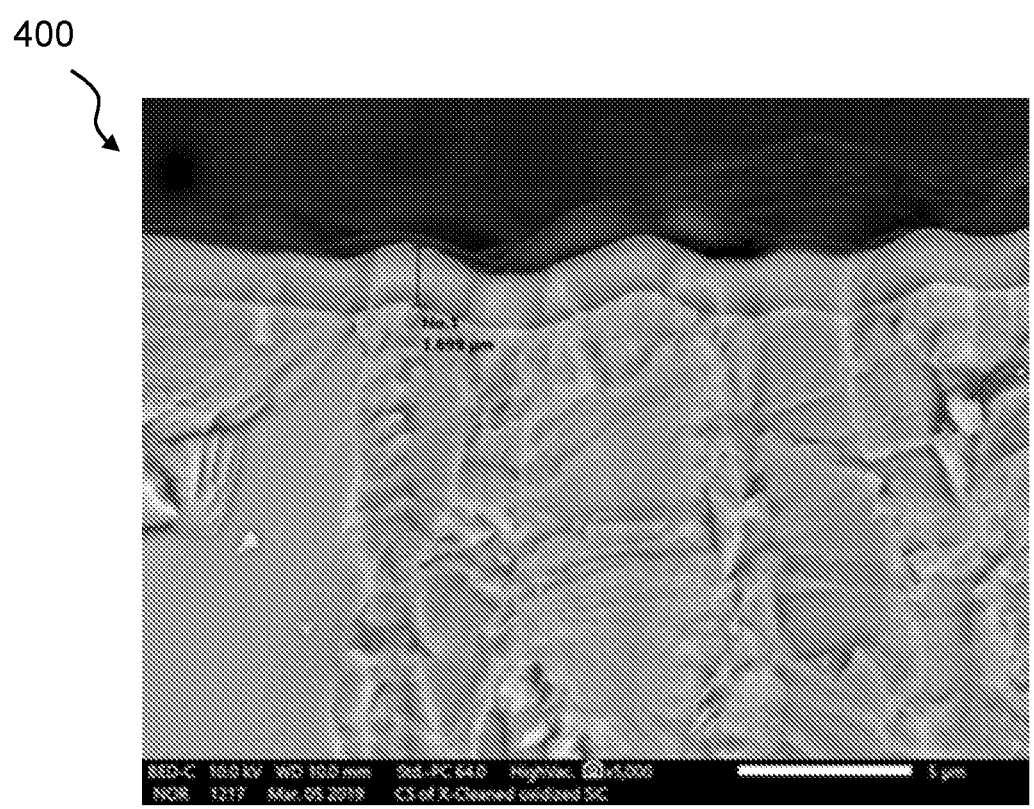

The above-mentioned and other features and advantages of the disclosure will be best understood from the following description referring to the attached drawings which demonstrate non-limitative exemplary embodiments. In the drawings, like reference numerals denote identical parts or parts performing an identical or comparable function or operation. Herein shows:

FIG. 1 a flowchart of the method steps according to an aspect of the invention;

FIG. 2a-2c details of a CVD SiC article processed according to an aspect of the invention.

FIG. 1 shows steps of the processing of the chemical vapor deposition chamber article, for example a wafer carrier, of a wafer susceptor, a pre-heat ring, lift pin, or any other Silicon Carbide, SiC or Tantalum Carbide, TaC chamber article. These articles may be comprises of solid SiC or TaC or have a SiC or TaC coating over a graphite base material or other well known base material used for such components.

The etching of reactor articles such as wafer carriers is preferred to remove parasitic deposition on the articles after one or more runs in a CVD process, for example for manufacturing semiconductor materials through epitaxial growth on a wafer substrate. By etching the article, the parasitic deposition of SiC is removed such that article can be re-used and the end-of-life of the article is extended.

A typical etchant for these articles is a halogen such as HCl or $CL_2$. Because the reactions of SiC with HCl or $Cl_2$ and $SiO_2$ with HCl or $Cl_2$ and the associated free energy changes are different, a silicon oxide layer or even silicon oxycarbide on the SiC surface or CVD SiC coating surface can significantly reduce the etching of the SiC coating material. Alternatively, instead of protecting SiC material with a Silicon Oxide or Oxycarbide, parts could be made from, or coated with silicon oxycarbide replacing the traditionally utilized CVD SiC. Therefore, protecting the CVD-SiC material with a Silicon Oxide or Oxycarbide mitigates the problem of degrading the CVD-coated graphite, or Solid-CVD-SiC parts during the removal of the parasitic deposition in the SiC-epitaxy chamber. Herein, the mentioned SiC coating on graphite substrate or bulk SiC part, or part containing SiC phase has an oxide layer or oxidized surface at least, or has a minimum one oxide layer or oxidized surface. This or these oxide surfaces give a protection to the SiC coated parts or SiC contained part or metal carbide contained part or metal carbide coated part or pure SiC part or metal carbide part against the etch upon Choline gas or halogen gas or gases contain halogen gas.

The protective layer is obtained by a method 100 of processing an article of a chemical vapor deposition chamber for manufacturing semiconductor components, the method comprising the steps of:
providing 101 the article. The article having a body and a surface comprised of silicon carbide.
subjecting 102 the article to a $Cl_2$ based, pure $Cl_2$, or HCl etchant. At least part of the surface which is subject to parasitic deposition during the manufacturing of the semiconductor components in the chamber is subjected to the etchant. However, preferably at least the whole surface which faces the inside of and/or is in contact with the process gases by which the parasitic deposition takes place is etched. Even more preferably, the whole article, i.e. all of the surfaces of the article are etched.

Once etched, the article is subjected to an oxidizing environment 103.

as a last step, the article is heated 104 to a predetermined elevated temperature, wherein carbon formed on the surface of the article during the step of etching is oxidized and removed as CO or $CO_2$ leaving a $SiO_2$ or SiO or $SiO_xC_y$ protective layer covering at least the part of the surface of the article being subject to parasitic deposition during the manufacturing of the semiconductor components in the chamber.

Previously, articles such as wafer carriers where mechanically grinded manually to remove the parasitic deposition. It is desirable to protect the CVD-SiC coating on the chamber articles from the effect of the utilized etchants, such that the parasitic deposition is removed with minimum, to no impact on the CVD-SiC material of the chamber articles. The introduction of a fully dense SiO2 or SiO or SiOxCy layer covering the surface of the CVD SiC material provides such protection against etchants.

The proposed SiC surface treatment has several advantages over the currently used surface treatments, amongst which: a complete etching of al parasitic SiC with the result of a fully cleaned article that can be reused. In the CVD reactor chamber or in a separate etching chamber $Cl_2$ based processing may not always be possible as not al chamber parts are resistant against $Cl_2$ etch. This may be resolve by replacing chamber parts with materials that are compliant to the process requirements like purity and can resist $Cl_2$ etching, or by separate processing of the articles in a separate processing chamber.

With the proposed method, a decrease of the formation of particles caused by the etch process via adjusting the etch time, etch frequency and operation temperatures may also be achieved.

Another advantage of the proposed method is that the oxidation step not only removes the remaining carbon layer after Cl2 etch but also can be used to repair the protective oxide layer on the surface. The currently known clean processes also etches the original CVD-SiC material as the parasitically deposited SiC layer possesses a non-uniform thickness. The currently known clean process does not include a repairing step of the original SiC coating. Therefore, with such clean process, the carrier deteriorates significantly during each presently utilized etch step. In the proposed method or with the proposed article, this repetitive oxidation step ensures that the thickness of this protective layer is maintained by successive regeneration of this protective $SiO_2$ or SiO or $SiO_xC_y$ layer, which also attributes to the repair of microcracks, might these cracks be present in in the CVD-SiC material of the chamber parts. The microcracks in the CVD SiC coating can be repaired by the formed silicon oxides at the crack surfaces of the CVD silicon carbide, i.e. the cracks are bonded together by the silicon oxides.

In FIG. 2a a CVD SiC coating was etched as carbon layer after $Cl_2$ etching at 1200 degrees Celsius for approximately 60 minutes. In FIG. 2b a oxidized CVD SiC coating is shown which does not show etch phenomenon after etching with a $CL_2$ at the 1200 degrees Celsius for the approximately 60 minutes. In FIG. 2c, the obtained fully dense $SiO_2$ oxide layer covered on the CVD SiC which gives sufficient protection to CVD SiC against the $Cl_2$ etch at high temperatures.

The $Cl_2$ etch is performed on CVD SiC coated graphite, and oxidized CVD SiC coated graphite. The figure demonstrates the achieved oxidized CVD SiC coating which has a $SiO_2$ layer with thickness or approximately 1.7 um. After 60 minutes of etching with pure $Cl_2$ at 1200 degrees Celsius, the CVD SiC coating was etched as carbon layer and the obtained oxidized CVD SiC coating does not show the etch phenomenon. The CVD SiC coating thickness is decreased from 147 um to 98 um, leaving a carbon layer with a thickness of 44 um on top; as shown in FIG. 2a.

Throughout the description, chamber articles are used to identify components of the CVD reaction chamber which are susceptible to proposed method. The expression chamber article should be interpreted in a broad sense, meaning also reaction chamber article, reaction chamber tool, reaction chamber equipment, reaction chamber replaceable parts, etc. The skilled person will appreciate that all such SiC and/or TaC (coated) components may be provided with an oxidized surface in order to achieve a high etch resistance.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

Furthermore, the invention may also be embodied by processing through more or less steps than provided in the embodiments described here, wherein multiple process steps are described.

A person skilled in the art will readily appreciate that method steps may typically be performed separate from the semiconductor manufacturing process, in order to obtain a CVD SiC article with oxidized surface which may be used by semiconductor OEM manufacturers. The method steps may however also be performed on non-oxidized CVD SiC articles by such OEMs, either through a separate ex-situ "reaction chamber article oxidization process" which may be performed in a (separate) CVD reaction chamber prior, and which creates a CVD SiC article in accordance with the invention. The method steps may however also be performed in-situ, e.g. in the SiC epi-deposition reactor, in the CVD reaction chamber during the actual semiconductor manufacturing process.

Moreover, the person skilled in the art will readily appreciate that some of these steps may be performed in parallel, sequentially, or repeatedly, wherein each of the articles may undergo one, multiple, or all of the method steps several times.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope thereof.

The invention claimed is:

1. A chemical vapor deposition chamber article such as a wafer carrier, for manufacturing semiconductor components, said chamber article comprising:
    a body; and
    a surface comprised of metal carbide;
    wherein said surface comprises a protective layer at least on parts of said surface which are subject to parasitic deposition during said manufacturing of said semiconductor components in said chamber;
    wherein said protective layer comprises an oxidized surface; and
    wherein the protective layer is maintained during said manufacturing.

2. The chemical vapor deposition chamber article according to claim 1, wherein said metal carbide comprises silicon carbide.

3. The chemical vapor deposition chamber article according to claim 1, wherein said metal carbide comprises Tantalum carbide.

4. The chemical vapor deposition chamber article according to claim 1, wherein said protective layer comprises a silicon dioxide surface.

5. The chemical vapor deposition chamber article according to claim 1, wherein said protective layer comprises a silicon monoxide surface.

6. The chemical vapor deposition chamber article according to claim 1, wherein said protective layer comprises a silicon oxycarbide surface.

7. The chemical vapor deposition chamber article according to claim 1, wherein said body of said article comprises silicon carbide.

8. The chemical vapor deposition chamber article according to claim 1, wherein said body of said article comprises a graphite core having a silicon carbide coated surface.

9. The chemical vapor deposition chamber article according to claim 1, wherein said protective layer is obtained by subjecting said article to a $Cl_2$ based, pure $Cl_2$, or HCl etchant.

10. The chemical vapor deposition chamber article according to claim 9, wherein said protective layer is obtained by subjecting said etched article to an oxidation process at elevated temperatures converting carbon at said surface obtained from said etching into a $SiO_2$ or SiO or $SiO_xC_y$ protective layer.

11. A method of processing an article of a chemical vapor deposition chamber for manufacturing semiconductor components, said method comprising the steps of:
    providing said article, said article having a body and a surface comprised of silicon carbide;
    providing a protective layer at least on parts of said surface which are subject to parasitic deposition during said manufacturing of said semiconductor components in said chamber, and wherein providing said protective layer comprises obtaining an oxidized surface; and
    maintaining the oxidized surface during said manufacturing.

12. The method of processing an article according to claim 11, wherein said step of providing said protective article comprises:
    subjecting said article to a halogen based etchant, comprising a $Cl_2$ based, pure $Cl_2$, or HCl etchant.

13. The method of processing an article according to claim 11, wherein said step of providing said protective article further comprises:

subjecting said article to an oxidizing environment;

heating said article to a predetermined elevated temperature, wherein carbon formed on said surface of said article during said step of etching is oxidized and removed as CO or $CO_2$ thereby forming a $SiO_2$ or SiO or $SiO_xC_y$ protective layer covering at least said part of said surface of said article being subject to parasitic deposition during said manufacturing of said semiconductor components in said chamber.

14. A chemical vapor deposition chamber article processed by the method according to claim 11, wherein said chamber article comprises any one of the group of a wafer carrier, wafer susceptor, pre-heat ring, or lift pin, cover segments, ceilings or other parts used in an epitaxial chemical vapor deposition growth chamber.

* * * * *